(12) United States Patent
Kozaki

(10) Patent No.: US 6,798,668 B2
(45) Date of Patent: Sep. 28, 2004

(54) RECEIVING APPARATUS

(75) Inventor: Masato Kozaki, Suita (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/201,300

(22) Filed: Jul. 24, 2002

(65) Prior Publication Data

US 2003/0021095 A1 Jan. 30, 2003

(30) Foreign Application Priority Data

Jul. 25, 2001 (JP) ........................................ 2001-224701

(51) Int. Cl.[7] .............................................. H05K 7/14
(52) U.S. Cl. ..................... 361/800; 361/816; 361/818; 174/35 R; 174/51; 455/188.02; 455/283
(58) Field of Search ................... 361/800, 818, 361/816, 752, 797; 174/35 R, 51; 455/300, 283, 301, 188.02

(56) References Cited

U.S. PATENT DOCUMENTS 4,590,617 A * 5/1986 Kraemer ..................... 455/328
4,697,044 A * 9/1987 Ishikawa ................... 174/35 R
5,355,532 A * 10/1994 Kubo et al. .................. 455/301
5,438,690 A * 8/1995 Tsukuda ..................... 455/300

FOREIGN PATENT DOCUMENTS

JP 5-308219 11/1993
JP 7-038827 2/1995

OTHER PUBLICATIONS

Shield case for electronic apparatus, Otani et al., PUb No. US 2003/0128534 A1 and Pub date: Jul. 10, 2003.*

* cited by examiner

Primary Examiner—David Martin
Assistant Examiner—Hung Bui
(74) Attorney, Agent, or Firm—Birch, Stewart, Kolasch & Birch, LLP (57) ABSTRACT

In a receiving apparatus according to the present invention, a shield plate, which is made of metal, is mounted above IF amplifiers and output terminal mounting parts of a circuit substrate, thereby decreasing adverse effects caused by a back lid with unstable earthing. This produces a stable earthing condition, and further, changes a condition where signals are reflected in a space produced in the apparatus, resulting in the improvement of its isolation characteristic.

10 Claims, 9 Drawing Sheets

RECEIVING APPARATUS

FIELD OF THE INVENTION

The present invention relates to receiving apparatuses for satellite broadcasting. More specifically, the invention relates to receiving apparatuses having a capability of receiving a plurality of video signals and outputting other signals to a plurality of tuners.

BACKGROUND OF THE INVENTION

A radio wave transmitted from a satellite includes at least one polarized wave, and each polarized wave has a video signal. For example, there are several types of polarized waves such as a vertically polarized wave and a horizontally polarized wave (V•H) and a right-hand circularly polarized wave and a left-hand circularly polarized wave (R•L).

Among receiving apparatuses for satellite broadcasting which receive radio waves transmitted from a satellite, there is one type of receiving apparatus for satellite broadcasting with one Low Noise block downconverter (hereinafter referred to as LNB) which receives signals transmitted from a plurality of satellites. Also, there is another type of receiving apparatus for satellite broadcasting with an LNB which extracts a plurality of IF signals (video signal) by utilizing two or more local oscillating circuits having respectively different oscillation frequencies. Currently, the dominating receiving apparatus for satellite broadcasting is the type of apparatus with one LNB which extracts a plurality of video signals (two kinds, four kinds, or more of video signals).

Figure 1:
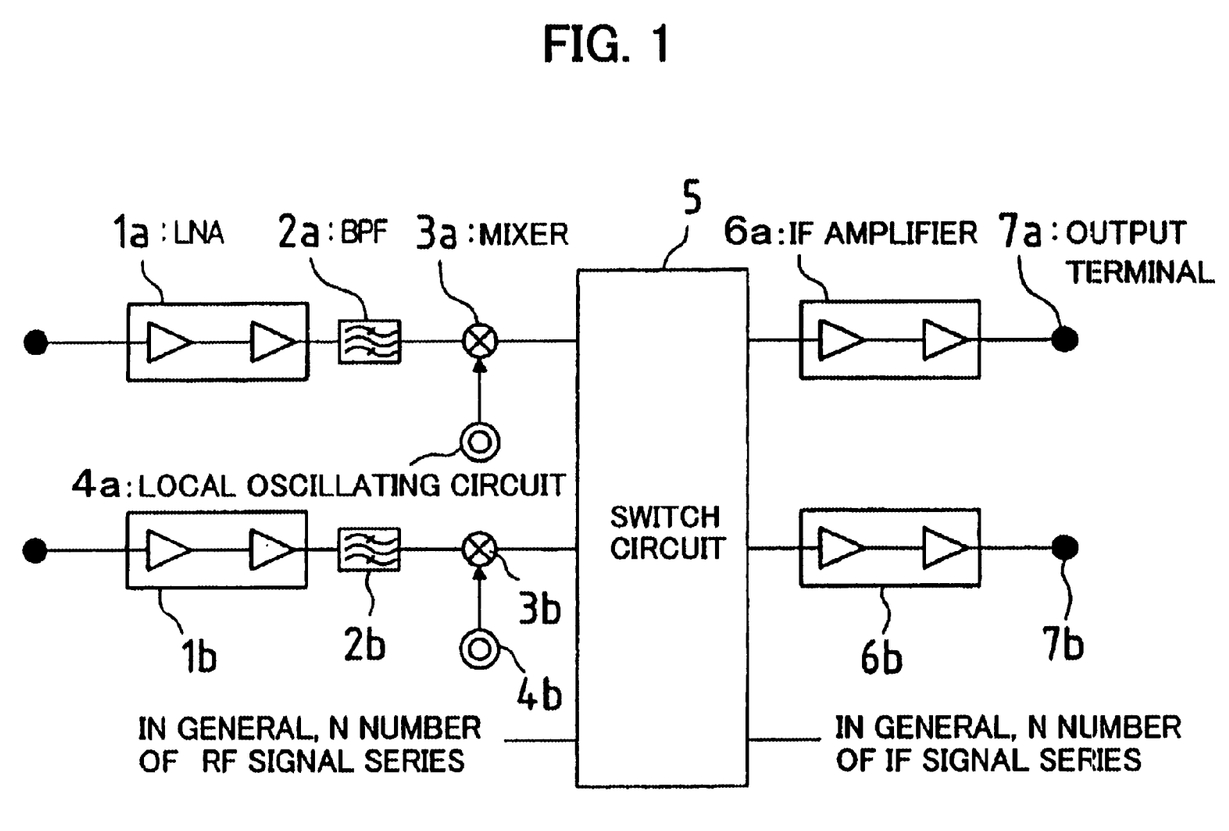
FIG. 1 is a drawing of circuit configuration of a receiving apparatus.

FIG. 1 shows an example of a circuit configuration of the type of LNB which outputs a plurality of IF signals.

The LNB in the example mainly includes the following circuits parts.

(1) Low Noise Amplifiers (hereinafter referred to as LNAs) 1a and 1b: Amplify weak signals (of 10 GHz band) transmitted from satellites in low noise characteristic.
(2) Band Pass Filters (hereinafter referred to as BPFs) 2a and 2b: Band-limit the signals amplified in low noise characteristics.
(3) Local oscillating circuits 4a and 4b: Produce a reference frequency (local signal) for downconverting.
(4) Mixer circuits 3a and 3b: Mix the signals amplified in the LNA with the local signal, and convert (downconvert) the resultant signals into IF signals (of 1 GHz band).
(5) Switch circuit 5: Extracts the IF signal selected by a tuner (not shown), which is connected to output terminals 7a and 7b, from among the signals converted in the mixer circuits 3a and 3b, and the extracted IF signal is sent to the IF amplifiers 6a and 6b.
(6) IF amplifiers 6a and 6b: Amplify the IF signal extracted in the switch circuit 5 to output it to the output terminals 7a and 7b.

Incidentally, the receiving apparatus that receives radio waves transmitted from satellites has the problem of isolation characteristic. The isolation characteristic is a capability of preventing the entrance of undesired signals as opposed to desired signals. In the receiving apparatus, it is ideal that undesired signals not being selected never leak out. However, in fact, undesired signals in the range of approximately 20 to 30 dB enter into the terminal to which desired signals should be inputted, because of problems caused by the circuit configuration and the member arrangement in the receiving apparatus.

In order to obtain a better isolation characteristic of the receiving apparatus, it is necessary not only to make the isolation characteristic of the switch circuit 5 better, but also to prevent the video signals after being amplified by the IF amplifiers 6a and 6b from entering into the respective output terminals 7b and 7a that are not appropriate terminals to which the IF amplifiers 6a and 6b should be inputted. However, a conventional receiving apparatus has found a difficulty of achieving this. The reason of the difficulty will be described below.

Figure 2:
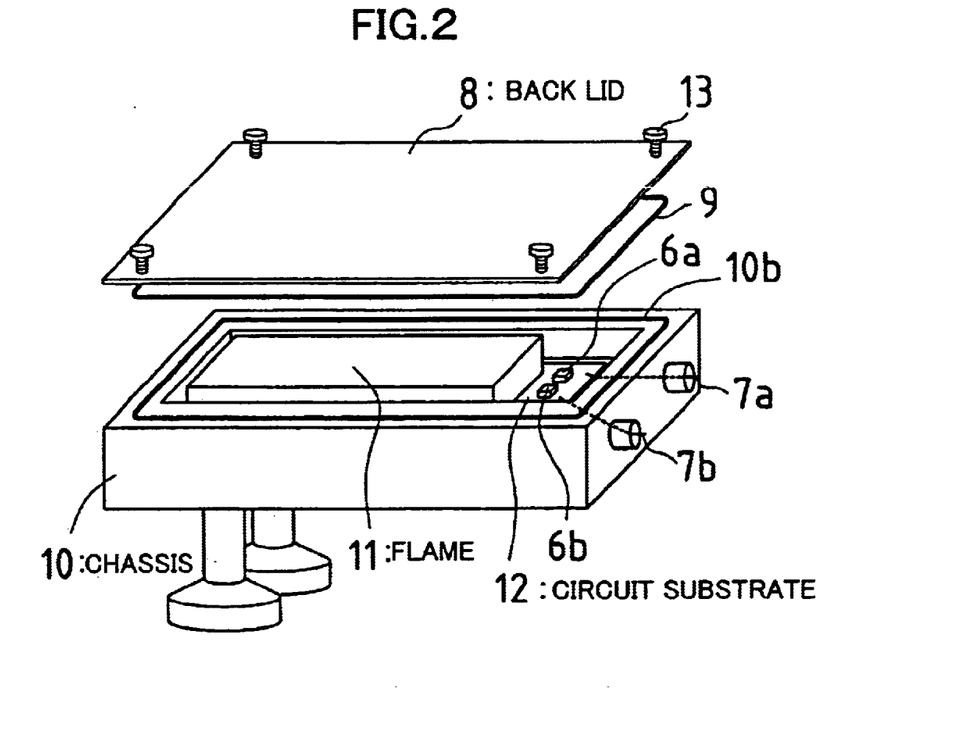
FIG. 2 is a perspective view schematically showing a structure of a receiving apparatus.
Figure 3:
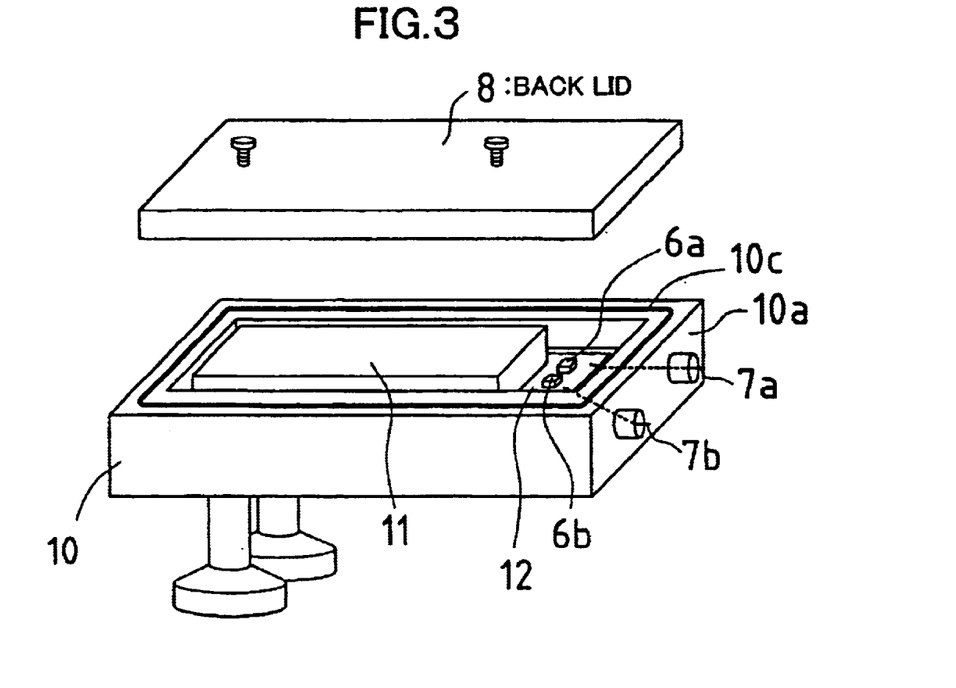
FIG. 3 is a perspective view schematically showing a structure of a receiving apparatus.

First, to maintain hermeticity, a receiving apparatus must be generally hermetic in a space where a circuit substrate is included. Conventional methods for hermetically sealing are the following methods: one is the method in which a metallic lid (hereinafter referred to as a back lid 8) is fixed to a chassis 10 with a packing 9, as shown in FIG. 2 (in FIG. 2, note that, a reference numeral 10b is a groove where the packing is placed); or another is the method in which while a bottom part of the back lid 8 is fit into a groove 10c, a seal adhesive such as silicon is filled so that the back lid 8 is fixed to the chassis 10, as shown in FIG. 3. These methods for hermetically sealing cause an electrically poor connection between the back lid 8 and the chassis 10. Accordingly, in these methods for hermetically sealing, the back lid 8 is insufficiently grounded in a radio-frequency band, so that the receiving apparatus is prone to the occurrence of resonance.

Because of this, in the conventional receiving apparatus, there is a high possibility that factors such as resonance cause the video signals selected by the tuner which is connected to one output terminal to enter into the other output terminal, when a back lid that is grounded insufficiently is fit to the receiving apparatus. Therefore, even if the receiving apparatus without the back lid realizes a high isolation characteristic (of, for example, 40 dB or more), the receiving apparatus with the back lid is difficult to realize a high isolation characteristic.

Here, as a technique for shielding a receiving apparatus, Japanese Unexamined Patent Application No. 308219/1993 (Tokukaihei 5-308219, published on Nov. 19, 1993) discloses a microwave detector which realizes a minimum length of connecting path between the mixing diode and an intermediate frequency processing circuit portion, as well as excellent operation with avoiding generation of the noise without a first intermediate frequency filter being affected by an antenna input and/or the output of a first local oscillator. The microwave detector has such a structure that the intermediate frequency processing circuit is installed around an extended portion of the mixing diode on the lower surface of a printed circuit board, that a shield casing is mounted directly on the lower surface side of the printed circuit board in such a manner that it may cover the intermediate frequency processing circuit portion, and that a metal layer is formed on the upper surface of the printed circuit board, thereby completely shielding the intermediate frequency processing circuit.

Also, Japanese Unexamined Patent Application No. 38827/1995 (Tokukaihei 7-38827, published on Feb. 7, 1995) discloses an IF substrate incorporating tuner. To prevent the leakage of spurious radiation to the IF substrate, the IF substrate incorporating tuner has such a structure that a tuner substrate and an IF substrate are shielded from each other by a shield plate, and the tuner substrate and the IF substrate are connected via through capacitor provided on the shield plate. The feature of the invention is that the through capacitor as a connecter section makes it possible to almost completely shield the tuner substrate, thereby preventing the leakage of oscillator to the IF substrate and the deterioration of the radiation.

Furthermore, Japanese Unexamined Patent Application No. 163755/1999 (Tokukaihei 11-163755, published on Jun.

18, 1999) discloses an up/down tuner. To reduce a local oscillator circuits of up converter and a down-converter affecting each other, and inflow noise that comes into the tuner from the outside, the up/down tuner has a structure that an up converter part and a down converter part are connected to each other by an IF connecting part which makes a coaxial shielded structure (a structure that a signal line is shielded by an electrically conductive material grounded).

However, the techniques described in the above patent applications relates to reduction of the noise from other circuits, the leakage of spurious radiation, and inflow noise that comes from the outside, in other words, relates to noise-resistant characteristic. That is, the techniques described in the above patent applications do not relate to improvement of isolation characteristic, or a capability of preventing the entrance of undesired signals as opposed to desired signals. Further, the above patent applications do not suggest the increase in the isolation characteristic.

SUMMARY OF THE INVENTION

The present invention has been developed to solve the above problem, and an object of the present invention is to provide a receiving apparatus which is capable of realizing a high isolation characteristic of, for example, 40 dB or more.

In order to achieve the above object, a receiving apparatus according to the present invention includes a circuit substrate having IF amplifiers and output terminals connected to tuners, in which a plurality of different radio waves such as polarized waves and satellite waves are received, and a plurality of video signals are extracted from radio waves thus received and are amplified so as to be outputted to the tuners. The receiving apparatus further includes a shield member made of metal (for example, a metallic plate such as stainless steel or phosphor bronze) for obtaining a high isolation characteristic. More specifically, the shield plate is mounted above the IF amplifiers and output terminal mounting parts included in the circuit substrate.

Inside the receiving apparatus, the level of signals is highest in the IF amplifiers and output terminal mounting parts. In this regard, according to the above arrangement, the shield member which is made of metal is mounted above the IF amplifiers and the output terminal mounting parts of the circuit substrate. Because of this, the shield member makes it possible to decrease adverse effects caused by the back lid with unstable earthing.

That is, due to the occurrence of resonance, the inflow of undesired signals increases in a space which is produced by the mounting of the back lid with unstable earthing. In this regard, in the present invention, provision of the shield member having stable earthing inside the space causes change of the condition where signals are reflected in the space, thereby preventing the occurrence of resonance. This results in the improvement of isolation characteristic (for example, high isolation characteristic of 40 dB or more).

For a fuller understanding of the nature and advantages of the invention, reference should be made to the ensuing detailed description taken in conjunction with the accompanying drawings.

DESCRIPTION OF THE EMBODIMENTS

As shown in a block diagram of FIG. 1, a receiving apparatus which utilizes the present invention includes LNAs 1a and 1b, BPFs 2a and 2b, mixer circuits 3a and 3b, local oscillating circuits 4a and 4b, a switch circuit 5, IF amplifiers 6a and 6b, and output terminals 7a and 7b.

The LNAs 1a and 1b amplify weak signals (of 10 GHz band) transmitted from satellites in low noise characteristic. The BPFs 2a and 2b band-limit the signals amplified in low noise characteristic. The mixer circuits 3a and 3b mixes the signals band-limited with a local signal, and convert (downconvert) the resultant signals into IF signals (of 1 GHz band). The local oscillating circuits 4a and 4b produces a reference frequency (local signal) for downconverting. The switch circuit 5 extracts the IF signal selected by a tuner (not shown), which is connected to output terminals 7a and 7b, from among the signals converted in the mixer circuits 3a and 3b. The IF amplifiers 6a and 6b amplify the IF signal extracted in the switch circuit 5. The output terminals 7a and 7b are connected to the tuner.

These parts are mounted and carried on a circuit substrate 12 (see FIG. 3). Further, circuit parts other than the IF amplifiers 6a and 6b and the output terminals 7a and 7b are housed in a flame 11 shown in FIG. 3.

Referring to Figures, the following will describe an embodiment of the present invention.

Figure 4:
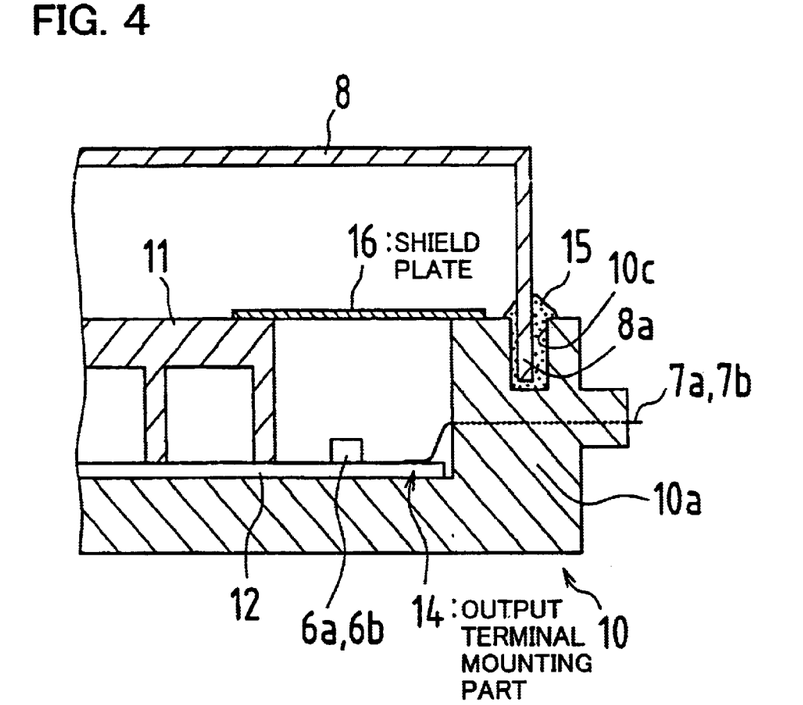
FIG. 4 is a sectional view schematically showing a structure of principle parts in an embodiment of the present invention.

FIG. 4 is a sectional view schematically showing a structure of principle parts in the receiving apparatus of the present invention.

The receiving apparatus of the present embodiment is provided with a chassis 10 for housing the circuit substrate 12, the flame 11, and a back lid 8.

A groove 10c for filling a seal adhesive is formed on a top surface of an upright wall 10a of the chassis 10. While a bottom part 8a of the back lid 8 is fit into the groove 10c, a seal adhesive 15 such as silicon is filled so that the back lid 8 can be fixed to the chassis 10. Further, this makes it possible to maintain hermeticity in a space where the circuit substrate 12 is included.

The IF amplifiers 6a and 6b are located between the flame 11 and the upright wall 10a of the chassis 10. The output terminals 7a and 7b are deposited in the rear of the IF amplifiers 6a and 6b. The output terminals 7a and 7b are connected to output terminal mounting parts 14 of the end part of the circuit substrate 12 (the end part of the side where the IF amplifiers 6a and 6b are on board).

The feature of the embodiment is that a shield plate 16 (shield member) is provided above the IF amplifiers 6a and 6b and the output terminal mounting parts 14 of the circuit substrate 12. A plate which is made of metal such as stainless steel or phosphor bronze is used for the shield plate 16.

According to the embodiment, the metallic shield plate 16 is deposited in the part that has the highest level of signals in the receiving apparatus, that is, above the part extending from the backside of the IF amplifiers 6a and 6b located on the circuit substrate 12 to the output terminal mounting parts 14. Because of this, the shield plate 16 makes it possible to decrease adverse effects caused by the back lid 8 with unstable earthing.

That is, due to the occurrence of resonance, the inflow of undesired signals increases in a space which is produced by the mounting of the back lid 8 with unstable earthing. In this regard, in the present invention, provision of the shield plate 16 with stable earthing inside the space causes change of the condition where signals are reflected in the space, thereby preventing the occurrence of resonance. Therefore, it is possible to prevent the inflow of the undesired signals and to increase the isolation characteristic.

Next, referring to FIGS. 5 through 9, specific examples of a structure that the shield plate 16 is fixed.

Figure 5:
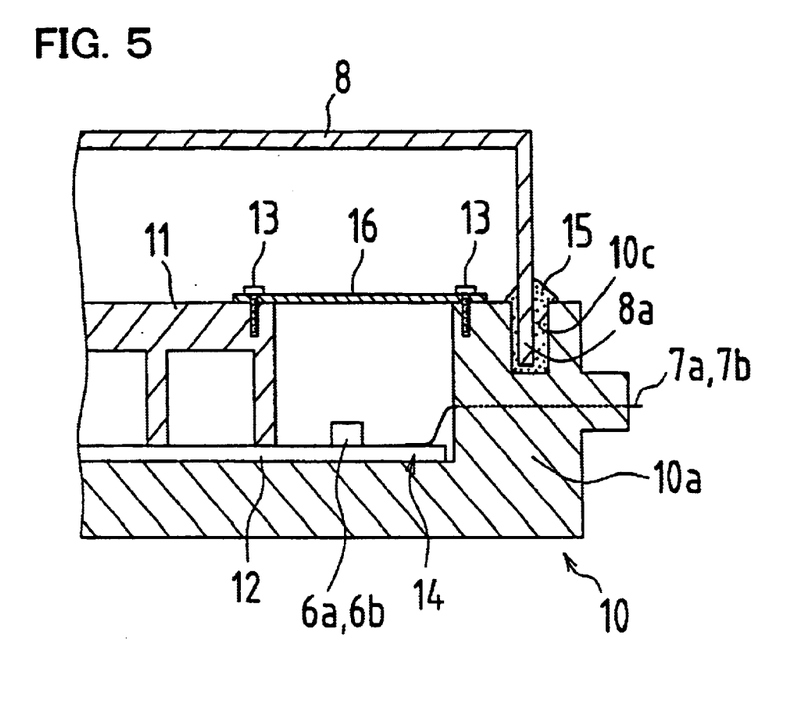
FIG. 5 is a sectional view schematically showing an example of a structure of a fixed shield plate.

The feature of an example shown in FIG. 5 is that the shield plate 16, which is made of metal such as stainless steel or phosphor bronze, is fixed to the chassis 10 and the flame 11 by metallic screws 13. Note that, in the example shown in FIG. 5, the shield plate 16 is fixed to both the chassis 10 and the flame 11 by screws. However, the present invention is not limited to this. It may be arranged in such a manner that the shield plate 16 is fixed to either the chassis 10 or the flame 11.

Figure 6:
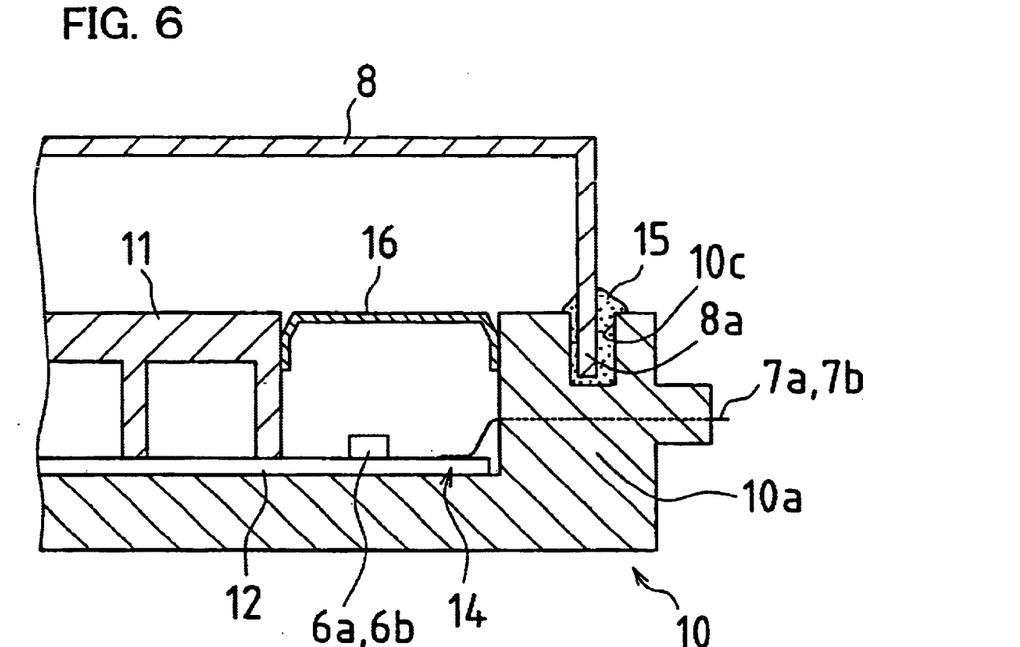
FIG. 6 is a sectional view schematically showing an example of a structure of a fixed shield plate.

In an example shown in FIG. 6, a plate made of metal such as stainless steel or phosphor bronze, which is bended in a U shape so as to have spring properties, is used for the shield plate 16. The feature of the example is that the U-shaped shield plate 16 is caught between the chassis 10 and the flame 11, so that the shield plate 16 is fixed to the chassis 10 and the flame 11 with its elasticity.

As in the example shown in FIG. 6, in case where used is the shield plate 16 having spring properties, there is an advantage that the shield plate 16 is mounted with a single motion without performing a special processing to the chassis 10 or the flame 11 and without using members (for example, screws or adhesives) for securing the shield.

Figure 7:
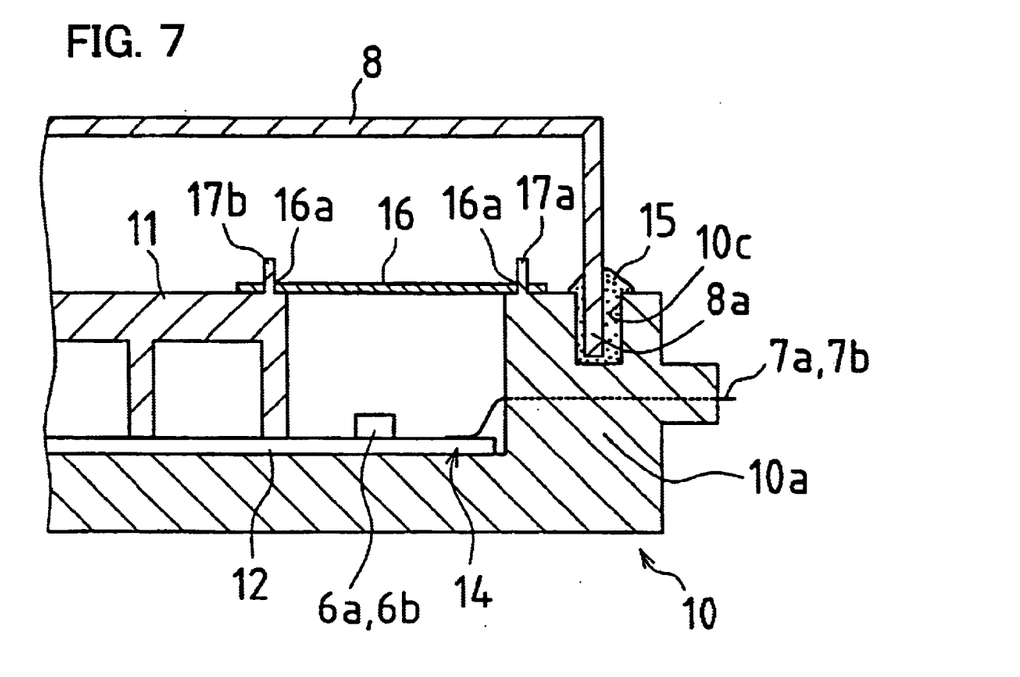
FIG. 7 is a sectional view schematically showing an example of a structure of a fixed shield plate.

The feature of an example shown in FIG. 7 is that the shield plate 16, which is made of metal such as stainless steel or phosphor bronze, has openings 16a provided thereon, that the chassis 10 and the flame 11 are provided with respective pins 17a and 17b for securing the shield plate 16 at the positions corresponding to the openings 16a on their top surfaces, and that the pins 17a and 17b are fit into the openings 16a so that the shield plate 16 is fixed to the chassis 10 and the flame 11.

Figure 8:
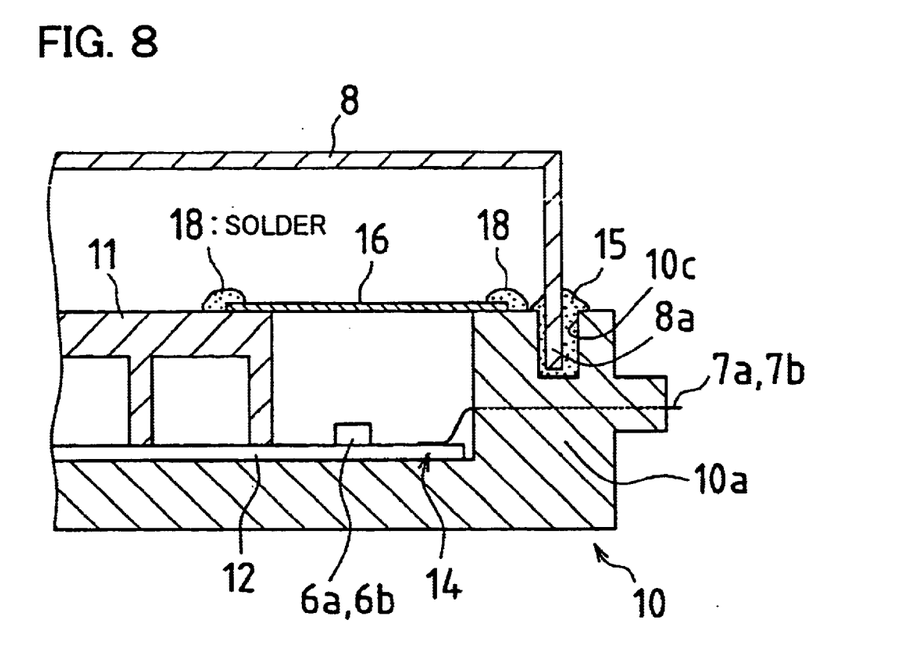
FIG. 8 is a sectional view schematically showing an example of a structure of a fixed shield plate.

The feature of an example shown in FIG. 8 is that the shield plate 16, which is made of metal such as stainless steel or phosphor bronze, is fixed (soldered) to the chassis 10 and the flame 11 with solder 18. Note that, the shield plate 16 may be fixed by welding, instead of soldering.

Figure 9:
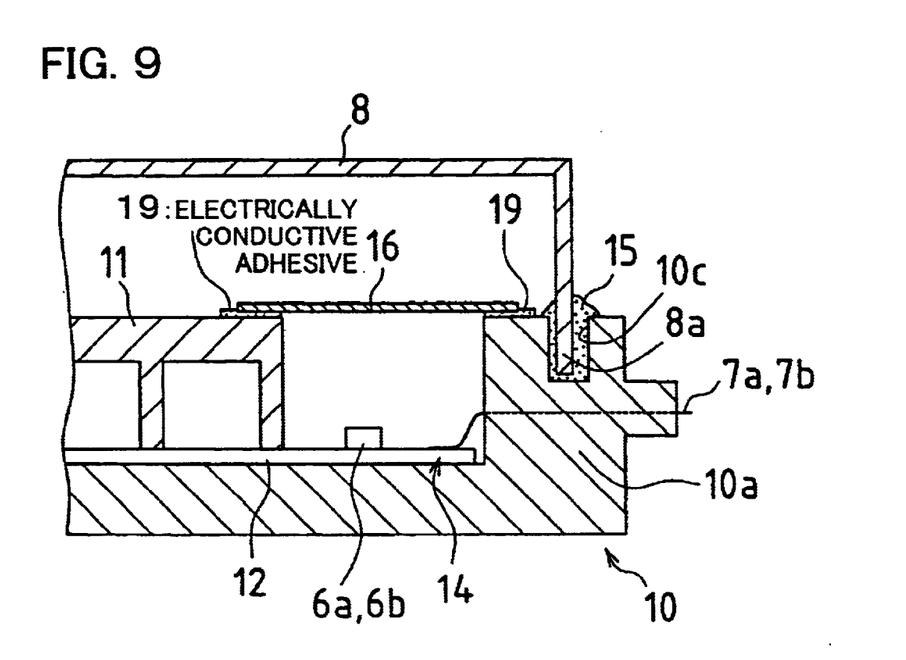
FIG. 9 is a sectional view schematically showing an example of a structure of a fixed shield plate.

The feature of an example shown in FIG. 9 is that the shield plate 16, which is made of metal such as stainless steel or phosphor bronze, is fixed to the chassis 10 and the flame 11 by an electrically conductive adhesive 19.

Figure 10:
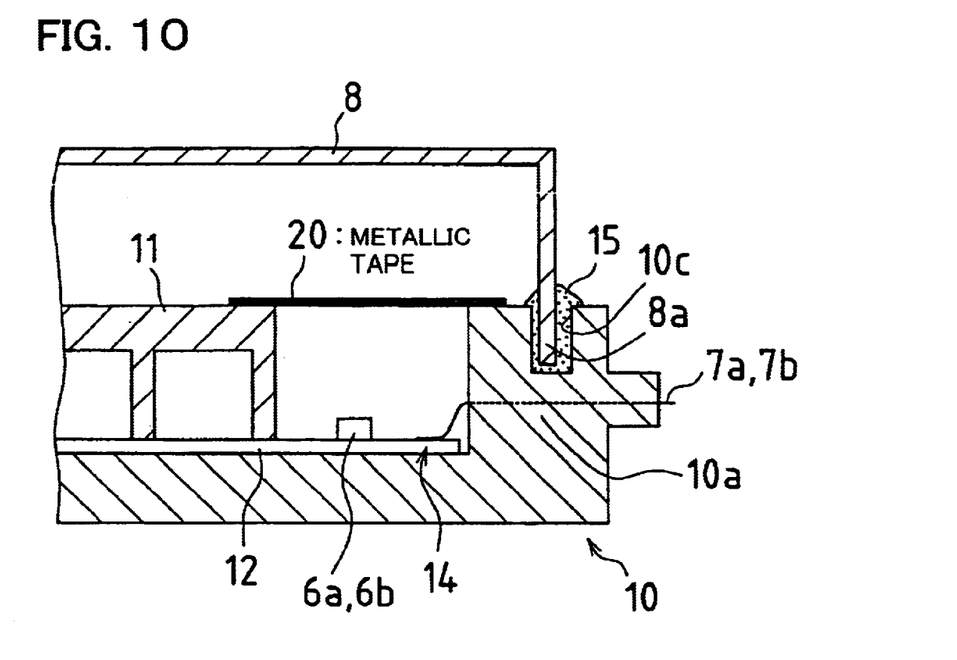
FIG. 10 is a sectional view schematically showing a structure of principle parts in another embodiment of the present invention.

The aforementioned embodiments show the examples that the metallic shield plate 16 is used. Here, instead of the metallic shield plate 16, for example, a metallic tape 20 such as a copper tape as shown in FIG. 10 may be provided above the IF amplifiers 6a and 6b and the output terminal mounting parts 14 of the circuit substrate 12 to improve isolation characteristic. Or, a metallic foil 21 such as an aluminum foil may be provided above the IF amplifiers 6a and 6b and the output terminal mounting parts 14 of the circuit substrate 12 to improve isolation characteristic.

Figure 11:
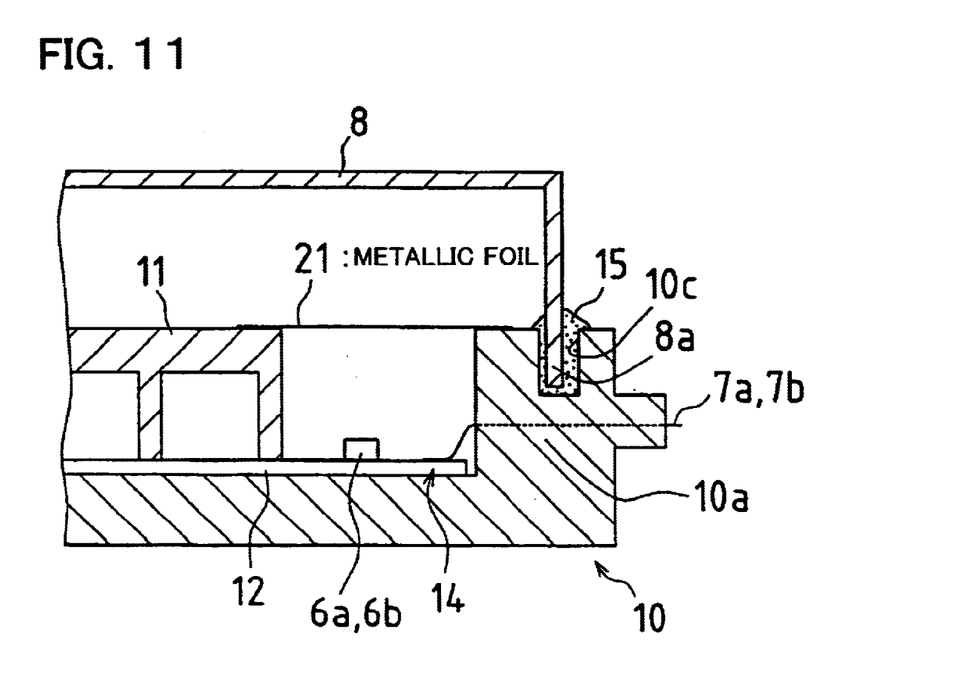
FIG. 11 is a sectional view schematically showing a structure of principle parts in a further embodiment of the present invention.

Note that, with respect to the structures shown in FIG. 10 and FIG. 11, methods for securing the metallic tape 20 and the metallic foil 21 to the chassis 10 and the flame 11 includes screwing, soldering, welding, or using an electrically conductive adhesive.

Here, the present invention is not limited to the embodiments shown in FIGS. 4 through 11, and it may be the embodiment in which a plurality of structures are combined from among the structures shown in FIGS. 4 through 11.

Next, specific effects (example of numerical values) produced by the embodiments of the present invention will be described with reference to FIGS. 12 through 14.

Figure 12:
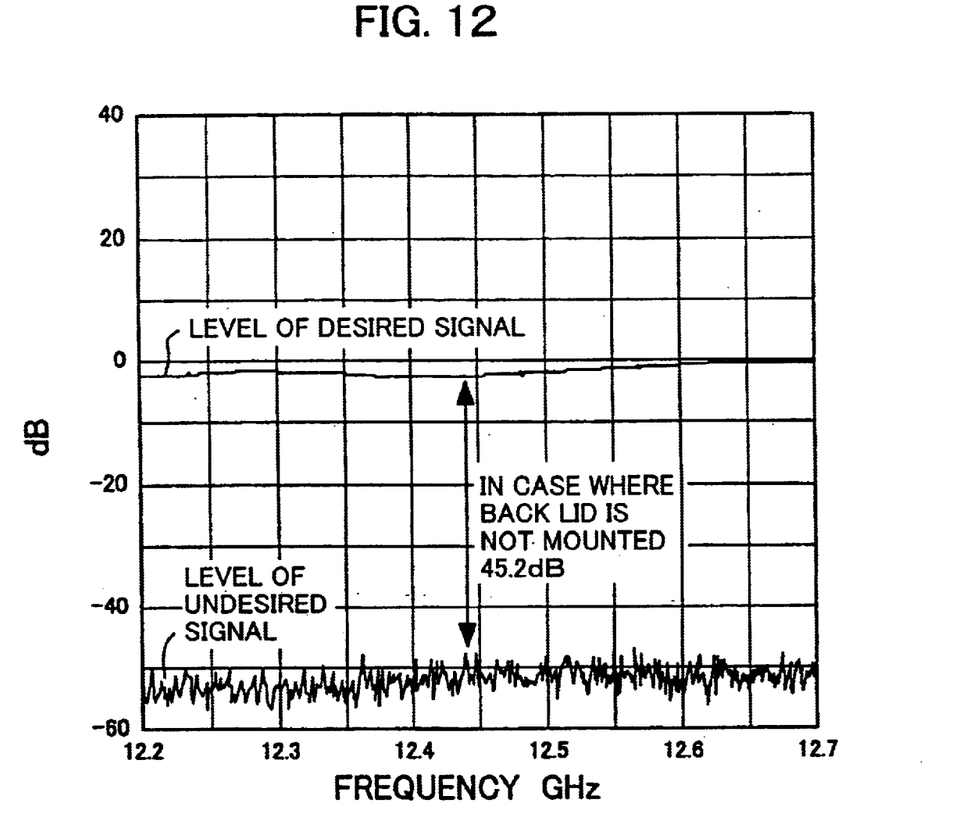
FIG. 12 is a graph of isolation characteristic in a state that a back lid is not mounted in the receiving apparatus of FIG. 3.

First, FIG. 12 is a graph of isolation characteristic in a state that the back lid 8 is not mounted in the receiving apparatus of FIG. 3. As seen from the graph of FIG. 12, in case where the back lid 8 is not mounted, the receiving apparatus has extremely excellent isolation characteristic of 45.2 dB.

Figure 13:
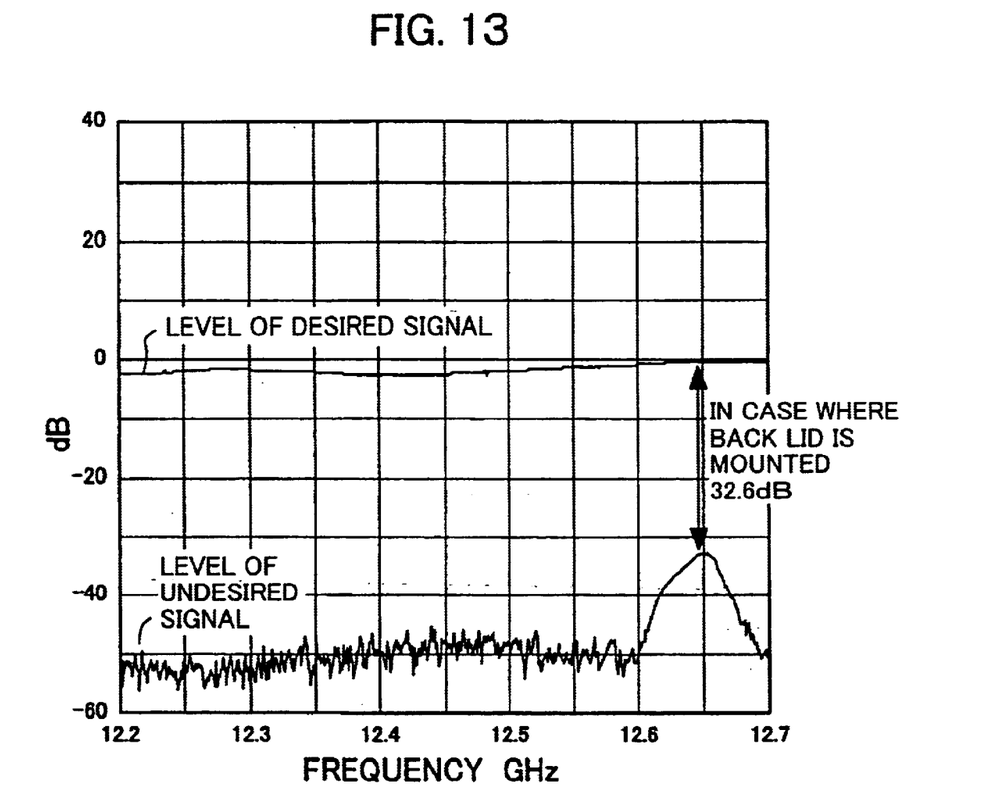
FIG. 13 is a graph of isolation characteristic in a state that a back lid is mounted in the receiving apparatus of FIG. 3.

Secondly, FIG. 13 is a graph of isolation characteristic in a state that the back lid 8 is mounted in the receiving apparatus of FIG. 3. As seen from the graph of FIG. 13, its isolation characteristic decreases to 32.5 dB because the receiving apparatus with the back lid 8 mounted causes the increase in inflow of undesired signals due to the occurrence of resonance.

Figure 14:
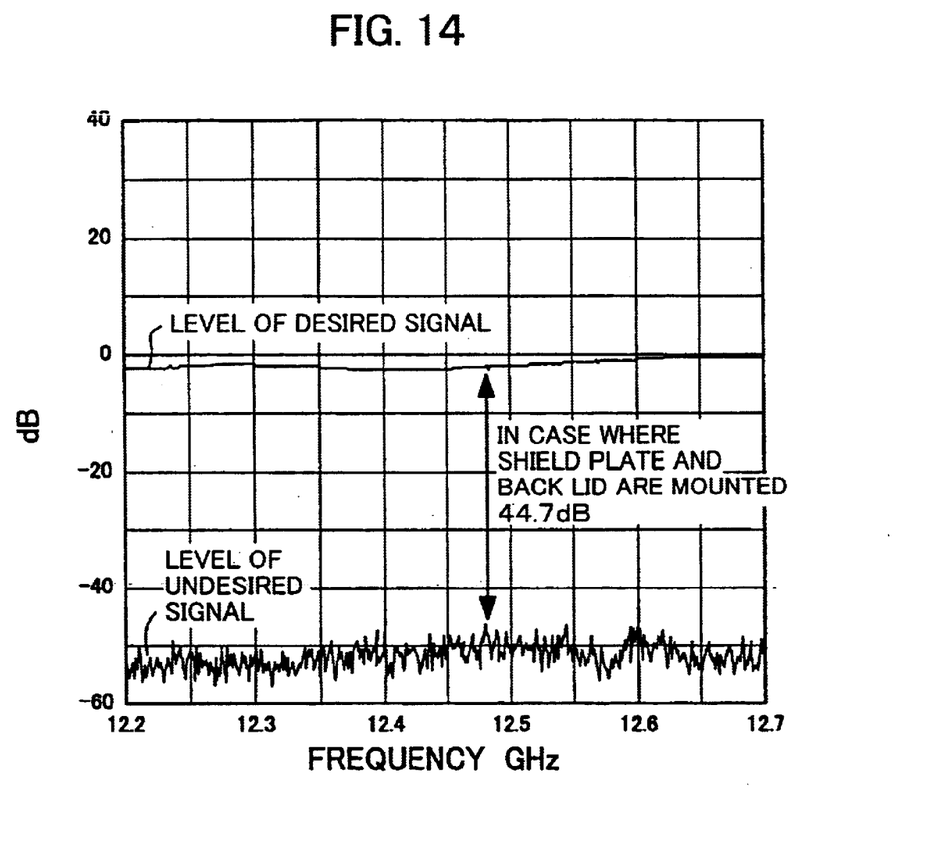
FIG. 14 is a graph of isolation characteristic in a state that a shield plate and a back lid are mounted in the embodiment of FIG. 6.

Finally, FIG. 14 shows a graph of isolation characteristic in the structure shown in FIG. 6 as one embodiment of the present invention, that is, in a state that the back lid 8 is mounted after the shield plate 16 having spring properties is fixed. As is apparent from the comparison between the graphs of FIG. 14 and FIG. 12, the receiving apparatus with the back lid 8 can obtain the isolation characteristic substantially equal to that of the receiving apparatus without the back lid 8 because the former apparatus is provided with the shield plate 16.

As described above, in the receiving apparatus of the present invention, given as a structure that the shield plate is fixed to the chassis and the flame can be the structure that the shield plate is fixed by screws or the structure that a metallic plate that is bended so as to have spring properties is used as a shield plate, and the shield plate is fixed with its elasticity.

Further, the structure that the shield plate has openings provided thereon as well as the chassis and the flame are provided with respective pins for securing the shield plate, and the pins are fit into the openings to fix the shield plate can be given.

Still further, the structure that the shield plate is fixed by soldering or welding, or the structure that the shield plate is fixed by the electrically conductive adhesive can be given.

Note that, the shield plate may be fixed to both of the chassis and the flame, or to either the chassis or the flame.

Here, in the receiving apparatus of the present invention, instead of the shield plate made of metal such as stainless steel or phosphor bronze, a metallic tape such as a copper tape or a metallic foil such as an aluminum foil may be adopted to improve isolation characteristic.

Further, the receiving apparatus according to the present invention includes a circuit substrate having IF amplifiers and output terminals connected to tuners, in which a plurality of different radio waves such as polarized waves and satellite waves are received, and a plurality of video signals are extracted from radio waves thus received and are amplified so as to be outputted to the tuners. The receiving apparatus further includes a shield plate made of metal for increasing a capability of preventing entrance of undesired signals as opposed to desired signals.

Still further, the receiving apparatus according to the present invention may have the arrangement that the shield plate is provided above the IF amplifiers and output terminal mounting parts included in the circuit substrate.

Yet further, the receiving apparatus according to the present invention may have the arrangement that the shield plate is fixed by screws.

Further, the receiving apparatus according to the present invention may have the arrangement that the shield plate is bended so as to have spring properties that cause the shield plate to be fixed with its elasticity.

Still further, the receiving apparatus according to the present invention may have the arrangement that the shield plate has openings, and respective pins are fit into the openings so as to fix the shield plate.

Yet further, the receiving apparatus according to the present invention may have the arrangement that the shield plate is soldered or welded.

Further, the receiving apparatus according to the present invention may have the arrangement that the shield plate is fixed via an electrically conductive adhesive.

Still further, the receiving apparatus according to the present invention may have the arrangement that a metallic tape is used instead of the shield plate.

Yet further, the receiving apparatus according to the present invention may have the arrangement that a metallic foil is used instead of the shield plate.

According to the receiving apparatus of the present invention, since the shield plate (or, a metallic tape or a metallic foil for shielding) is provided above the IF amplifiers and the output terminal mounting parts of the circuit substrate, it is possible to decrease adverse effects caused by the back lid with unstable earthing. Therefore, in the above receiving apparatus, it is possible to produce a stable earthing situation and to change the condition where signals are reflected in a space produced in the apparatus. As a result of this, in the above receiving apparatus, it is possible to improve the isolation characteristic, for example, to realize a high isolation characteristic of 40 dB or more.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A receiving apparatus hermetically sealed, comprising a circuit substrate having IF amplifiers and output terminals connected to tuners, in which a plurality of different radio waves are received, and a plurality of video signals are extracted from radio waves thus received and are amplified so as to be outputted to the tuners, said receiving apparatus further comprising:
a shield member made of metal for increasing a capability of preventing entrance of undesired signals as opposed to desired signals, wherein
the shield member is provided above the IF amplifiers and output terminal mounting parts included in the circuit substrate.

2. The receiving apparatus according to claim 1, wherein the shield member is fixed to a chassis and a flame by screws.

3. The receiving apparatus according to claim 1, wherein the shield member is bended so as to have spring properties that cause the shield member to be fixed to a chassis and a frame with its elasticity.

4. The receiving apparatus according to claim 1, wherein the shield member has openings, and a chassis and a flame have respective pins to be fit into the openings so as to be fixed to the shield member.

5. The receiving apparatus according to claim 1, wherein the shield member is soldered or welded so as to be fixed to a chassis and a flame.

6. The receiving apparatus according to claim 1, wherein the shield member is fixed to a chassis and a flame via an electrically conductive adhesive.

7. The receiving apparatus according to claim 1, wherein the shield member is a metallic tape.

8. The receiving apparatus according to claim 1, wherein the shield member is a metallic foil.

9. The receiving apparatus according to claim 1, wherein the shield member is a shield plate.

10. A receiving apparatus hermetically sealed, comprising a circuit substrate having IF amplifiers and output terminals connected to tuners, in which a plurality of different radio waves are received, and a plurality of video signals are extracted from radio waves thus received and are amplified so as to be outputted to the tuners, said receiving apparatus further comprising:
a shield member made of metal for obtaining a high isolation characteristic, wherein
the shield member is provided above the IF amplifiers and output terminal mounting parts included in the circuit substrate.

* * * * *